(12) United States Patent
Noshiro

(10) Patent No.: US 8,350,244 B2
(45) Date of Patent: Jan. 8, 2013

(54) VARIABLE RESISTANCE DEVICE, METHOD FOR MANUFACTURING VARIABLE RESISTANCE DEVICE, AND SEMICONDUCTOR STORAGE DEVICE USING VARIABLE RESISTANCE DEVICE

(75) Inventor: Hideyuki Noshiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 183 days.

(21) Appl. No.: 12/785,763

(22) Filed: May 24, 2010

(65) Prior Publication Data

US 2010/0230655 A1 Sep. 16, 2010

Related U.S. Application Data

(63) Continuation of application No. PCT/JP2007/073545, filed on Dec. 6, 2007.

(51) Int. Cl.
*H01L 29/02* (2006.01)
(52) U.S. Cl. .. 257/2; 257/4; 257/5; 257/3; 257/E29.002; 438/102; 438/103
(58) Field of Classification Search .................. 257/2–5, 257/E29.002; 438/102–103
See application file for complete search history.

(56) References Cited

U.S. PATENT DOCUMENTS

| | | | | |
|---|---|---|---|---|
| 5,719,446 A | * | 2/1998 | Taguchi et al. | 257/751 |
| 2005/0130448 A1 | * | 6/2005 | Olsen et al. | 438/786 |
| 2009/0097300 A1 | * | 4/2009 | Ishihara et al. | 365/148 |

FOREIGN PATENT DOCUMENTS

| | | | |
|---|---|---|---|
| JP | 2006-080259 A | | 3/2006 |
| JP | 2007-180202 A | | 7/2007 |
| WO | WO-2007074642 | * | 7/2007 |

OTHER PUBLICATIONS

Fujimoto, Masayuki et al, "TiO2 anatase nanolayer on TiN thin film exhibiting high-speed bipolar resistive switching", Applied Physics Letters, 2006, vol. 89, p. 223509-1-3.
Fujimoto, Masayuki et al, "High-Speed Resistive Switching of TiO2/TiN Nano-Crystalline Thin Film", Japanese Journal of Applied Physics, The Japan Society of Applied Physics, 2006, vol. 45, No. 11, pp. L310-L312.
Kinoshita, K. et al, "Bias polarity dependent data retention of resistive random access memory consisting of binary transition metal oxide", Applied Physics Letters, 2006, vol. 89, p. 103509-1-3.
Seo, S. et al, "Reproducible resistence switching in polycrystalline NiO films", Applied Physics Letters, Dec. 6, 2004, vol. 85, No. 23, p. 5655-57.
International Search Report of PCT/JP2007/073545, mailing date of Mar. 11, 2008.

* cited by examiner

*Primary Examiner* — Jami M Valentine
(74) *Attorney, Agent, or Firm* — Westerman, Hattori, Daniels & Adrian, LLP

(57) ABSTRACT

A variable resistance device includes a first electrode including a transition metal nitride film, a second electrode including a precious metal or a precious metal oxide, and a transition metal oxide film interposed between the first and second electrodes.

20 Claims, 15 Drawing Sheets

FIG.8

| STEP | TIME (sec) | DC power (kW) | GAS Ar (cc) | GAS N₂ (cc) | |
|---|---|---|---|---|---|
| 1 | 20 | 0 | 50 | 0 | INTRODUCE GAS |
| 2 | 30 | 1 | 50 | 0 | TURN POWER ON AND SPUTTER (START Ni DEPOSITION) |
| 3 | 20 | 1 | 5 | 45 | CHANGE GAS WITHOUT TURNING POWER OFF AND CONTINUE SPUTTER AFTER Ni DEPOSITION (SHIFT TO NiN DEPOSITION) |
| 4 | 5 | 0 | 0 | 0 | TURN POWER OFF AND STOP GAS SUPPLY AFTER NiN DEPOSITION |

FIG.9

| STEP | TIME (sec) | DC power (kW) | GAS Ar (cc) | GAS N₂ (cc) | |
|---|---|---|---|---|---|
| 1 | 20 | 0 | 50 | 0 | INTRODUCE GAS |
| 2 | 30 | 1 | 50 | 0 | TURN POWER ON AND SPUTTER (START Ni DEPOSITION) |
| 3 | 30 | 0 | 0 | 0 | TURN POWER OFF AND STOP GAS SUPPLY |
| 4 | 20 | 0 | 5 | 45 | INTRODUCE GAS |
| 5 | 20 | 1 | 5 | 45 | TURN POWER ON AND SPUTTER (START NiN DEPOSITION) |
| 6 | 5 | 0 | 0 | 0 | TURN POWER OFF AND STOP GAS SUPPLY |

FIG.11

| LOWER ELECTRODE Ti : Ni (TOTAL OF 100) | DEVICE YIELD (%) |
|---|---|
| 66 : 34 | 40 – 60 |
| 92 : 8 | 70 – 90 |

VARIABLE RESISTANCE DEVICE, METHOD FOR MANUFACTURING VARIABLE RESISTANCE DEVICE, AND SEMICONDUCTOR STORAGE DEVICE USING VARIABLE RESISTANCE DEVICE

CROSS-REFERENCE TO RELATED APPLICATIONS

This patent application is based upon and claims the benefit of priority under 35 USC 120 and 365(c) of PCT application JP2007/073545 filed in Japan on Dec. 6, 2007, the entire contents of which are incorporated herein by reference.

FIELD

The embodiments discussed herein are related to a variable resistance device capable of shifting between different resistances and a resistance variable memory for storing data by using the variable resistance device.

BACKGROUND

In these years, there is a demand for electronic devices to be fabricated with smaller size, less electric power consumption, and higher performance. In addition, there is also a demand for a non-volatile semiconductor memory that can be highly integrated, operated at high speed, and capable of maintaining data without any supply of power. A ReRAM (Resistive Random Access Memory) having a resistance variable is proposed as one of the non-volatile semiconductor memories of the next generation that can satisfy such demands. Particularly, binary transition metal oxides are proposed to be used as variable resistance films that can maintain different data values according to changes of resistance (see, for example, Non-patent documents 1 and 2).

FIG. 1A illustrates a configuration of a variable resistance device according to a related art example. The variable resistance device may also be referred to as "ReRAM device" in a case where the variable resistance device is used for a memory. The variable resistance device 100 has a variable resistance film 102 interposed between a pair of platinum (Pt) electrodes 101, 103. The variable resistance film 102 contains a transition metal(s) such as nickel oxide (NiO). FIG. 1B is a graph for describing activity of the variable resistance device 100. As indicated with arrow F in FIG. 1B, by applying a predetermined initial voltage to the variable resistance device 100, the variable resistance device 100 initiates a function of switching between two different resistance states. This initial process of applying voltage is referred to as "electroforming". Once the electroforming is started, the variable resistance device 100 can switch between a low resistance state and a high resistance state by controlling the applied electric current or electric voltage.

More specifically, as illustrated with broken lines in FIG. 1B, by applying a voltage pulse to the variable resistance device 100 being in a high resistance state (in this example, a reset state) the IV profile of the variable resistance device 100 steeply changes at the vicinity of 1.5 V and switches to a low resistance state (in this example, a set state) (indicated with arrow a). In this example, the shift to the low resistance state is controlled to a predetermined level (indicated with arrow b) because the current is limited to a predetermined value (current limitation value). Then, the low resistance state of the variable resistance device 100 is maintained without having to apply a voltage pulse to the variable resistance device 100 (indicated with arrow c). In order to reset the variable resistance device 100 from the low resistance state to the high resistance state, one method is to cancel the limiting of the current and apply a voltage pulse of approximately 1 V. Another method is to cancel the limiting of the current and apply a current pulse of approximately 10 mA. Thereby, after exceeding the current limitation value, the resistance gradually increases (indicated with arrow d) and then abruptly switches to a high resistance state (indicated with arrow e).

Because the variable resistance film 102 of the variable resistance device 100 is an oxide material such as NiO, a precious metal resistant to oxidation (e.g., platinum (Pt), iridium (Ir)) is used to form the electrodes 101, 103 on both sides of the variable resistance film 102. Typically, however, a high voltage and a high current are required in order for an electrode formed of a precious metal to operate. Thus, it is difficult to mount an electrode formed of a precious metal on a memory device.

In the example illustrated with FIGS. 1A and 1B, the electroforming voltage (approximately 5 V) and the reset current (approximately 10 mA) are high. The electroforming voltage and the reset current of the example significantly surpass the criterion of the voltage (3.3 V or less) and the criterion of the current (1 mA or less), respectively, of the electrode that can be mounted on a memory device.

As for a variable resistance device that can achieve high speed switching, there is proposed a configuration having a $TiO_2/TiN$ nanocrystal thin film interposed between upper and lower electrodes formed of platinum (Pt) (see, for example, Non-patent document 3).

In this non-patent document 3, a TiN film having a film thickness of 200 nm is formed on a lower platinum electrode having a film thickness of 200 nm. Then, the surface of the TiN film is oxidized by annealing in an oxygen atmosphere of 400° C. for 20 minutes, to thereby form a $TiO_2$ film on the TiN film. Then, fabrication of a ReRAM device is completed after forming an upper platinum electrode on the $TiO_2/TiN$ film.

As illustrated in FIG. 2A, in order to reduce the amount of electric current during reset, a ground side electrode (in this example, lower electrode) of a variable resistance device 10 may have a precious metal replaced with a transition metal such as nickel (Ni). A positive side electrode 13 (in this example, upper electrode) may be a platinum (Pt) electrode 13 that is resistant to oxidation. An NiO film 12 serving as a variable resistance film may be provided between the Ni electrode 11 and the Pt electrode 13. With this configuration, the current during reset can be reduced to an amount enabling the electrodes 11, 13 to be mounted on a storage device as illustrated in FIG. 2B.

However, with the configuration illustrated in FIG. 2A, corrosion due to reactive gas (e.g., chlorine ($Cl_2$)) may occur when performing fine processes on the lower electrode 11 formed of a transition metal (e.g., Ni). This corrosion may adversely affect stability of a device (e.g., storage device).

Non-patent document 1: K. Kinoshita et al., "Bias polarity dependent data retention of resistive random access memory consisting of binary transition metal oxide", Applied Physics Letter 89, 103509 (2006).

Non-patent document 2: S. Seo et al., "Reproducible resistance switching in polycrystalline NiO films", Applied Physics Letter, Vol. 85, No. 23, Dec. 6, 2004.

Non-patent document 3: M. Fujimoto et al., "High-speed resistive switching of $TiO_2/TiN$ nano-crystalline thin film", Japanese Journal of Applied Physics, Vol. 45, No. 11, 2006, pp. L310-L312.

SUMMARY

According to an aspect of the invention, there is provided a variable resistance device including: a first electrode including a transition metal nitride film; a second electrode including a precious metal or a precious metal oxide; and a transition metal oxide film interposed between the first and second electrodes.

Additional objects and advantages of the embodiments are set forth in part in the description which follows, and in part will become obvious from the description, or may be learned by practice of the invention.

The object and advantages of the invention may be realized and attained by means of the elements and combinations particularly pointed out in the appended claims.

It is to be understood that both the foregoing general description and the following detailed description are exemplary and explanatory and are not restrictive of the invention as claimed.

BRIEF DESCRIPTION OF THE DRAWINGS

FIG. 8 is a table illustrating a first method for depositing a NiN film on a Ni film in the method of manufacturing the variable resistance device of FIG. 3B;

FIG. 9 is a table illustrating a second method for depositing a NiN film on a Ni film in the method of manufacturing the variable resistance device of FIG. 3B;

FIG. 11 is a table for describing a relationship between the Ti:Ni ratio of a TiNi target and yield of a variable resistance device.

DESCRIPTION OF EMBODIMENT(S)

Preferred embodiments of the present invention will be explained with reference to accompanying drawings.

Figure 3A:
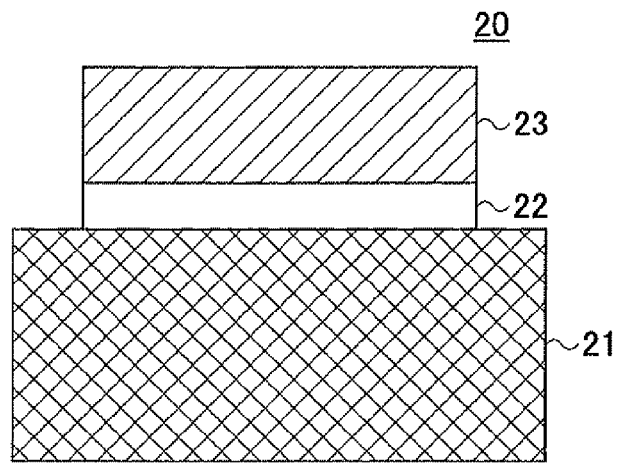
FIG. 3A is a schematic diagram illustrating a configuration of a variable resistance device according to an embodiment of the present invention.
Figure 3B:
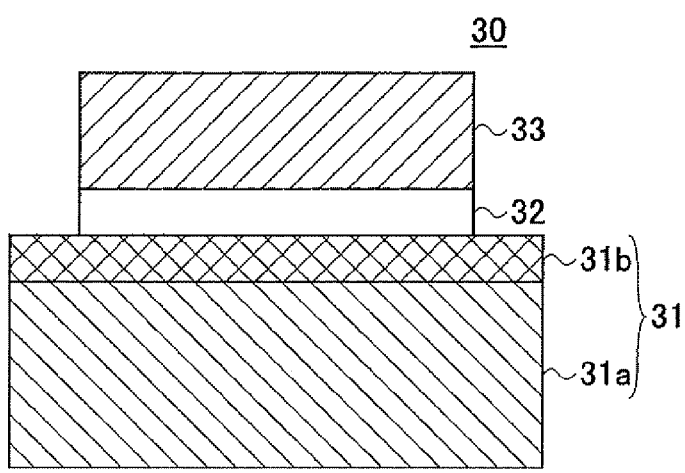
FIG. 3B is a schematic diagram illustrating a modified example of a configuration of a variable resistance device according to an embodiment of the present invention.

FIG. 3A is a cross-sectional view illustrating a configuration of a variable resistance device 20 according to an embodiment of the present invention. FIG. 3B is a cross-sectional view illustrating another variable resistance device 30 obtained by modifying the configuration illustrated in FIG. 3A.

In FIG. 3A, the variable resistance device 20 has a transition metal oxide film 22 (hereinafter also referred to as variable resistance film) interposed between a ground side electrode (hereinafter also referred to as first electrode or lower electrode) 21 and a positive side electrode (hereinafter also referred to as second electrode or upper electrode). The variable resistance film 22 is formed of a transition metal oxide (e.g., nickel oxide (NiO)). The lower electrode 21 is formed of a transition metal nitride (e.g., nickel nitride (NiN)). The upper electrode 22 is formed of a precious metal (e.g., platinum (Pt)) or an oxide of the precious metal. In this example, the lower electrode 21 has a film thickness of 100 nm, the transition metal oxide film 22 has a film thickness of 20 nm, and the upper electrode 22 has a film thickness of 50 nm. It is to be noted that the composition of the NiN of the lower electrode 21 is NixNy ($0<x\leq3$, $0<y\leq2$), and the composition of the NiO of the variable resistance film 22 is NiOz ($0<z\leq2$).

In a case where the lower electrode (ground side electrode) 21 is formed of a transition metal such as nickel (Ni), an exposed surface of the lower electrode easily reacts with a reactive gas used in performing fine processes on the variable resistance device 20 and is highly susceptible to corrosion. For example, in a case where chlorine is used as the reactive gas and applied to the lower electrode 21 formed of nickel (Ni), nickel chloride ($NiCl_2$) is generated. This nickel chloride results in corrosion. Thus, in order to prevent such corrosion, the lower electrode (ground side electrode) 21 according to an embodiment of the present invention is formed of a nitride of a transition metal. On the other hand, the upper electrode (positive side electrode) 23 is formed of a precious metal (e.g., platinum (Pt)) or an oxide of the precious metal. This is because a precious metal or an oxide of the precious metal is less reactive with a reactive gas and also more oxidation resistant than nickel.

Other than NiN, a nitride of a metal such as titanium (Ti), vanadium (V), manganese (Mn), iron (Fe), cobalt (Co), zinc (Zn), yttrium (Y), zirconium (Zr), niobium (Nb), molybdenum (Mo), hafnium (Hf), tantalum (Ta), or tungsten (W) may be used to form the lower electrode 21.

Other than NiO, an oxide of a metal such as titanium (Ti), vanadium (V), manganese (Mn), iron (Fe), cobalt (Co), zinc (Zn), yttrium (Y), zirconium (Zr), niobium (Nb), molybdenum (Mo), hafnium (Hf), tantalum (Ta), or tungsten (W) may be used to form the variable resistance film 22.

The transition material used for forming the lower electrode 21 and the transition material used for forming the variable resistance film 22 may be the same material or different materials.

In the modified example illustrated in FIG. 3B, a lower electrode (ground side electrode) 31 of a variable resistance device 30 has a transition metal nitride film 31b provided at an interface with a variable resistance film (NiO film) 32. For example, the lower electrode 31 includes a NiN film 31b provided at the interface with respect to the variable resistance film 32 and a Ni film 31a provided beneath the NiN film 31b. As described below, the border between the transition metal nitride film (NiN film) 31b and the transition metal film (Ni film) 31a is different depending on the growing method. In one example, the border between the transition metal nitride film 31b and the transition metal film 31a may gradually change to a nitride film. In another example, the border may distinctly divide the two layers. Either growth method could be used as long as the transition metal nitride film 31b is provided at the interface with the variable resistance film 32.

In the example of the variable resistance device 30, the Ni film 31a has a film thickness of 80 nm, the NiN film 31b has a film thickness of 20 nm-25 nm, and the variable resistance film 32 has a film thickness of 50 nm.

Figure 4:
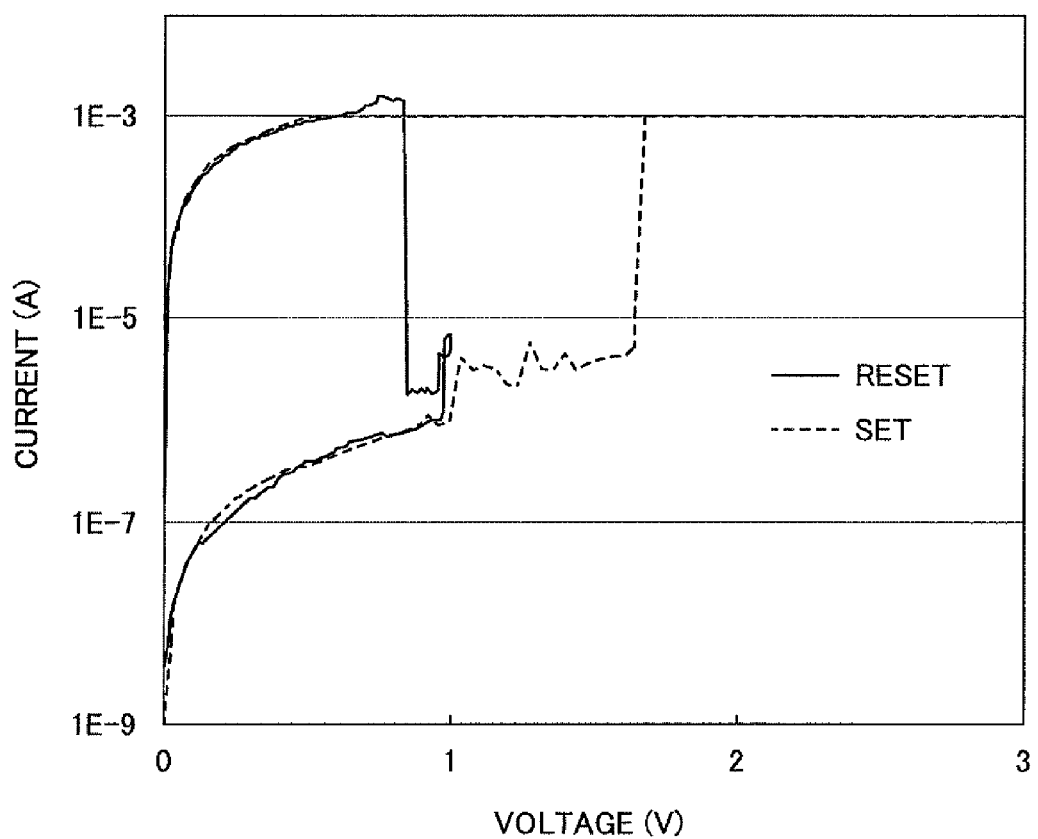
FIG. 4 is a graph illustrating an electric characteristic of a variable resistance device according to an embodiment of the present invention.

FIG. 4 is a graph illustrating an electric characteristic of the variable resistance device 20 having the configuration illustrated in FIG. 3A. In FIG. 4, the solid line indicates the characteristics of the current and the voltage during resetting (i.e. switching from a low resistance state to a high resistance state) and the broken line indicates the characteristics of the current and the voltage during setting (i.e. switching from a high resistance state). The characteristics are obtained from the average of performing a loop 3 times. In a case where Ni or NiN is used for a lower electrode, electroforming often becomes unnecessary. This is because the initial state of the variable resistance device 20 is a low resistance state. In this case, the area at which resistance is changed is created at the time of performing the first resetting operation.

Figure 1A:
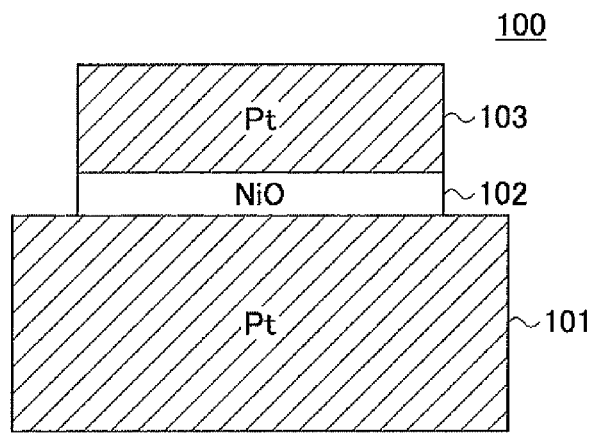
FIG. 1A is a schematic diagram illustrating a configuration of a variable resistance device according to a related art example.
Figure 1B:
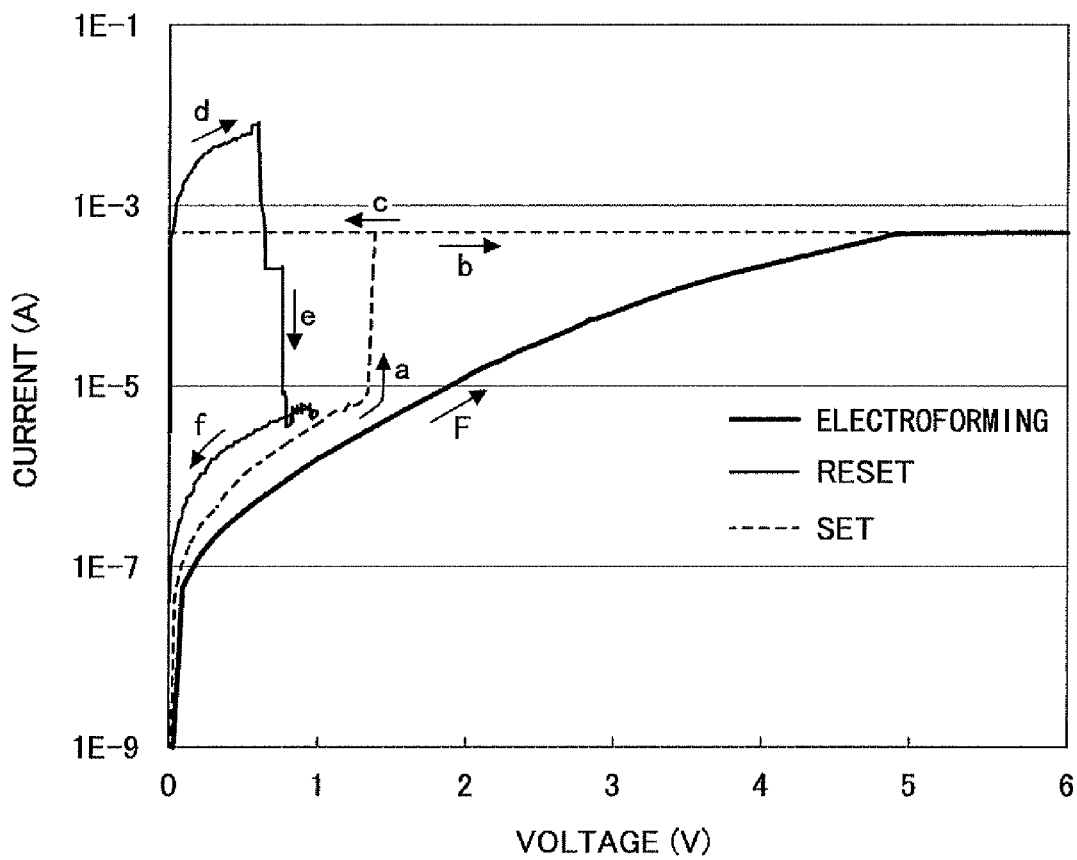
FIG. 1B is a graph illustrating an electric characteristic of a variable resistance device according to a related art example.

As illustrated in FIG. 4, compared to the configuration having a pair of Pt electrodes of FIG. 1B, the amount of current at the time of resetting can be reduced to an order of 1 mA by forming the lower electrode with a transition metal oxide such as NiN. That is, current and voltage characteristics within a range suitable for mounting on a memory device can be attained.

Figure 2A:
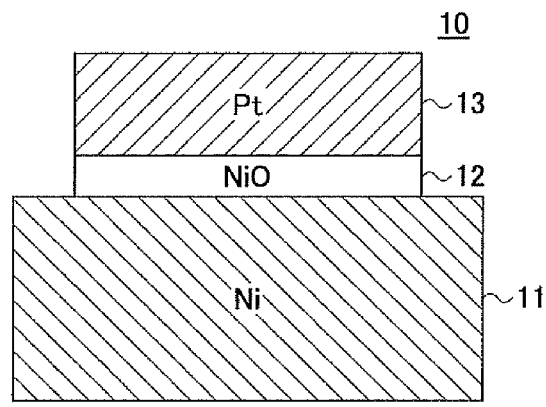
FIG. 2A is a schematic diagram illustrating a configuration of a variable resistance device according to another related art example.
Figure 2B:
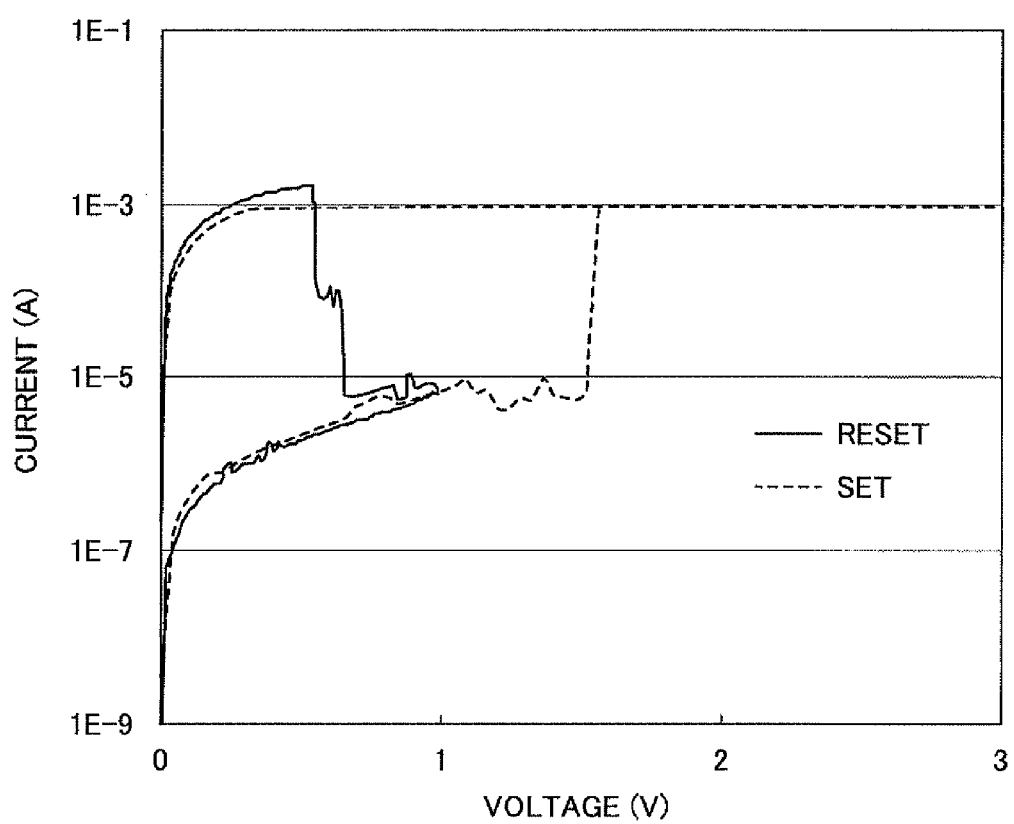
FIG. 2B is a graph illustrating an electric characteristic of a variable resistance device according to another related art example.
Figure 5A:
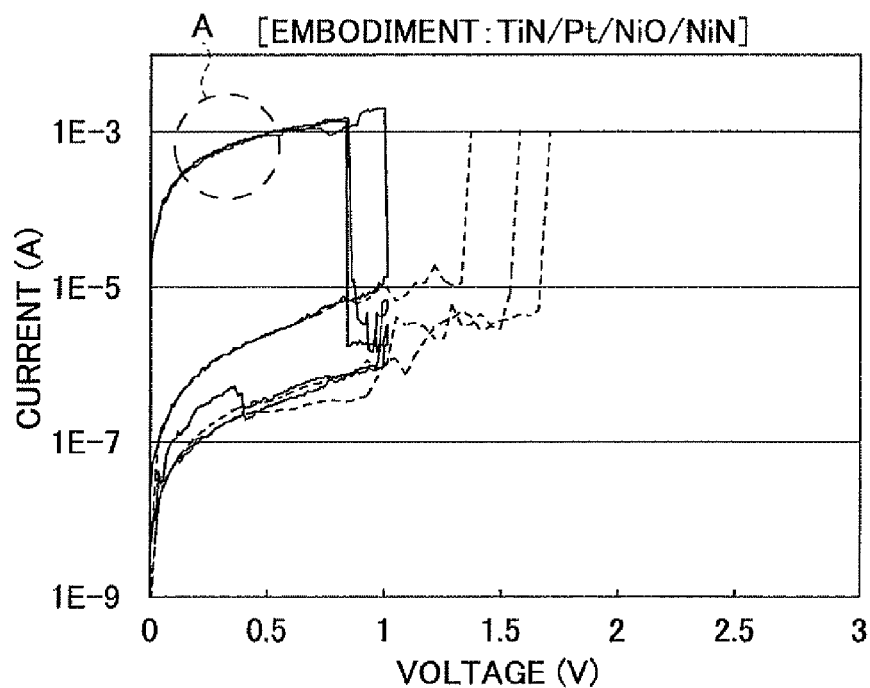
FIG. 5A is a graph illustrating an electric characteristic of a variable resistance device according to an embodiment of the present invention where an operation (loop) is repetitively performed on the variable resistance device of the embodiment of the present invention.
Figure 5B:
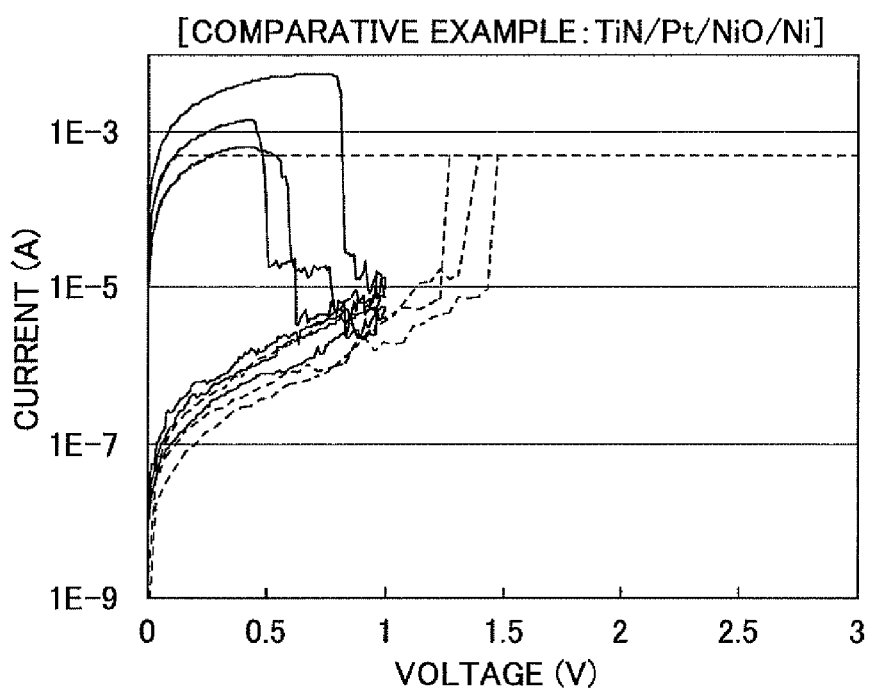
FIG. 5B is a graph illustrating an electric characteristic of a comparative example of a variable resistance device having the configuration of FIG. 2A where an operation (loop) is repetitively performed on the variable resistance device of the comparative example.

FIG. 5A illustrates an electric characteristic obtained from a sample based on the variable resistance device 20 of FIG. 3A. The sample has a lower electrode film 21 formed of a NiN film, an upper electrode film 23 formed of Pt, and a TiN film formed on the upper electrode film 23 (TiN (50 nm)/Pt (20 nm)). The electric characteristic illustrated in the graph of FIG. 5A is measured by performing a loop on the sample 3 times. FIG. 5B illustrates an electric characteristic obtained from a comparative sample based on the variable resistance device 10 of FIG. 2A. The comparative sample has a lower electrode film 11 formed of a Ni film, an upper electrode film 13 formed of Pt, and a TiN film formed on the upper electrode film 13 (TiN (50 nm)/Pt (20 nm)). The electric characteristic illustrated in the graph of FIG. 5B is measured by performing a loop on the comparative sample 3 times.

As illustrated in the circle A of FIG. 5A, corrosion can be prevented and the resetting activity (operation) can be steady owing to the configuration according to an embodiment of the present invention having the lower electrode (ground side electrode) 21 formed of a transition metal nitride. On the other hand, as illustrated in FIG. 5B, although the resetting current according to the configuration comparative example is reduced to an order of 1 mA, the resetting activity is unsteady. The cause of the unsteadiness is regarded to be the corrosion created in the lower electrode (Ni film) 11 during processing of the variable resistance device 10.

Figure 6A:
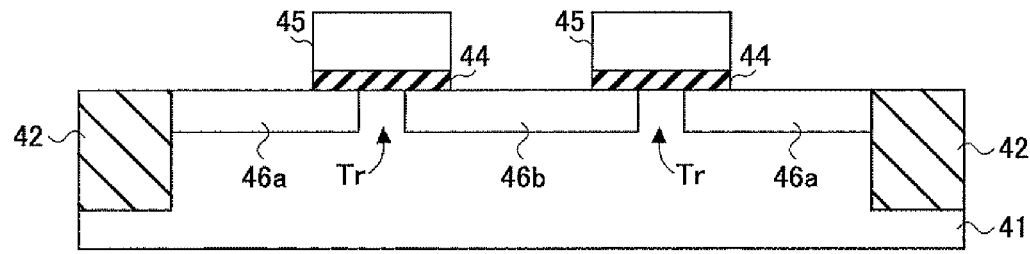
FIGS. 6A-6H are schematic diagrams illustrating processes for manufacturing a semiconductor storage device including the variable resistance device of FIG. 3A.

Next, processes for manufacturing a ReRAM (semiconductor storage device) 50 according to a first embodiment of the present invention is described with reference to FIGS. 6A through 6H. In the first embodiment, a ReRAM using the configuration of the variable resistance device 20 of FIG. 3A is fabricated. First, as illustrated in FIG. 6A, device isolation regions 42 (e.g., STI) are formed in a silicon substrate 41 and selection transistors Tr are formed by performing a regular MOS process. That is, a well (not illustrated) is formed in an area divided by the device isolation regions 42 and a gate electrode 45 is formed via a silicon insulation film 44. The gate electrode 45 may be shared with a word line. High concentration impurities 46a, 46b, which serve as the source and drain, are formed on corresponding sides of the gate electrode 45. However, for the sake of convenience, a sidewall spacer to be formed at a sidewall of the gate electrode 45 and a source/drain extension to be formed at a surface area of the silicon substrate 41 are not illustrated.

Figure 6B:
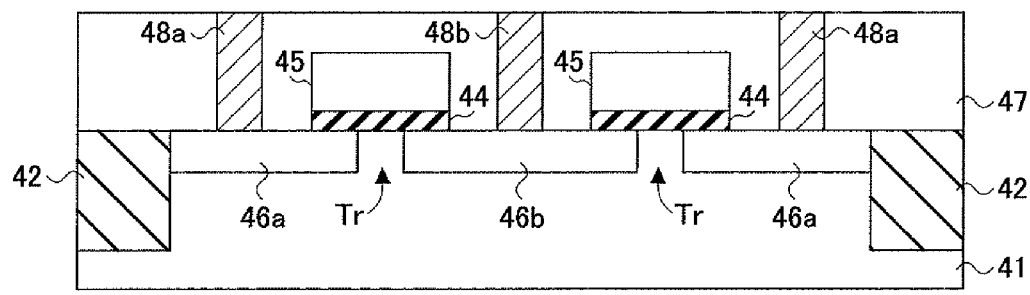

Then, as illustrated in FIG. 6B, a first interlayer insulation film 47 is deposited on the entire surface of the configuration illustrated in FIG. 6A. Then, contact plugs 48a, 48b, which are electrically connected to the high concentration impurities 46a, 46b, are formed. In this example, the high concentration impurity 46b provided between two gate electrodes 45 is the source, and the high concentration impurity 46a provided towards the STI 42 is the drain. For example, first, the first interlayer insulation film (in this example, silicon oxide film) 47 is deposited on the entire surface of the configuration illustrated in FIG. 6A by using a CVD (Chemical Vapor Deposition). Then, the deposited silicon oxide film 47 is flattened. Then, a photolithography method or a dry-etching method is performed on the silicon oxide film 47, to thereby form contact holes (not illustrated) in the silicon oxide film 47 with a depth reaching the source area (high concentration impurity) 46b and the drain area (high concentration impurity) 46a. Then, a titanium nitride (TiN) film (serving as a barrier metal) and a tungsten (W) film are deposited on the silicon oxide film 47 by using a CVD method. Then, the deposited titanium film and the tungsten film are flattened by CMP (Chemical Mechanical Polishing). Thereby, contact plugs 48a, 48b are formed in the silicon oxide film 47.

Figure 6C:
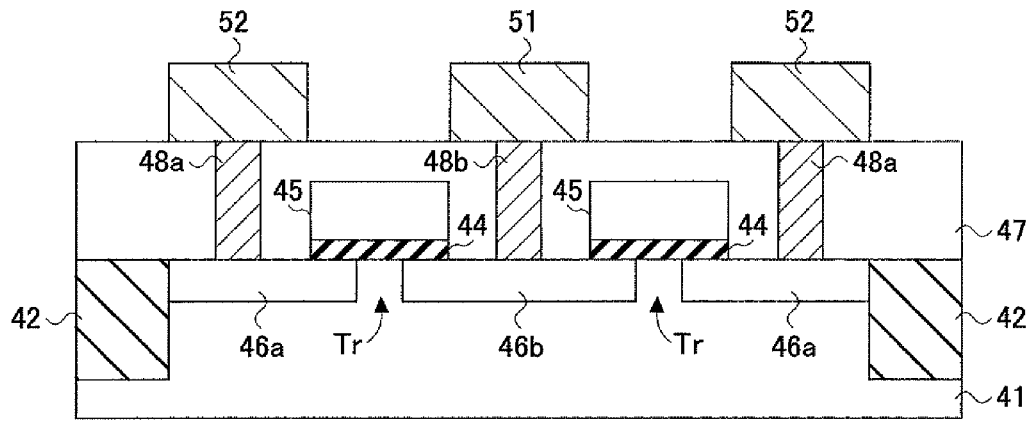

Then, as illustrated in FIG. 6C, a conductive film (e.g., aluminum (Al) film, copper (Cu) film) is deposited on the entire surface of the configuration illustrated in FIG. 6B. Then, a relay wiring (or electrode pad) 52 and a ground wiring 51 are formed by performing photolithography or dry-etching on the conductive film. The layer including the ground wiring 51 and the relay wiring 52 may also be referred to as a first wiring layer. The relay wiring 52 is connected to the drain 46a via the contact plug 48a. The ground wiring 51 is electrically connected to the source 46b via the contact plug 48b.

Figure 6D:
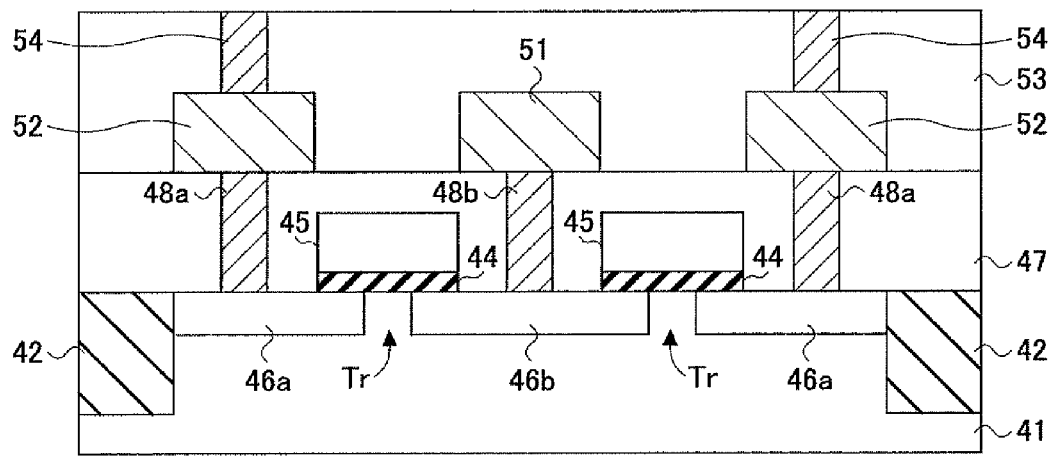

Then, as illustrated in FIG. 6D, a second interlayer insulation film 53 is deposited on the entire surface of the configuration illustrated in FIG. 6C by using a CVD method. Then, the second interlayer insulation film 53 is flattened. Then, contact plugs 54 are formed by performing photolithography or dry-etching on the second interlayer insulation film 53. The contact plugs 54 are electrically connected to corresponding relay wirings (electrode pads) 52.

Figure 6E:
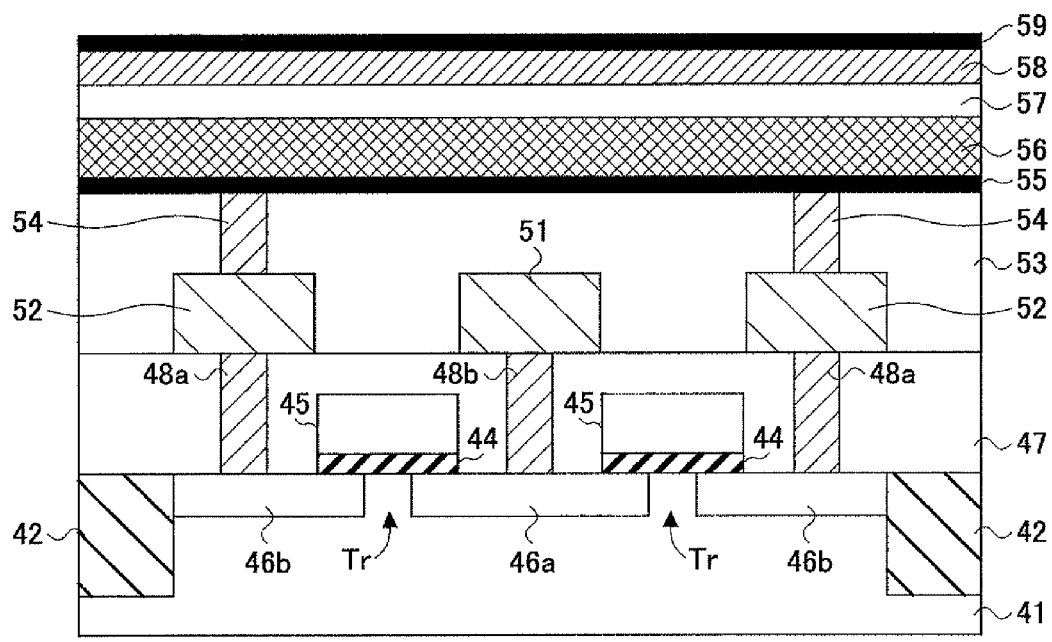

Then, as illustrated in FIG. 6E, a TiN film 55, a NiN film 56, a NiO film 57, a Pt film 58, and a TiN film 59 are deposited in this order by using a sputtering method. This process of FIG. 6E is the beginning of an operation of fabricating a variable resistance device. Although the TiN film 55 is used as a barrier film or an adhesive film, the TiN film 55 may also serve as a part of a lower electrode. Although the TiN film 59 is used as an antireflection film for patterning, the TiN film 59 may also serve as a part of an upper electrode. As one example, the TiN film 55 has a film thickness of 20 nm, the NiN film 56 has a film thickness of 100 nm, the NiO film 57 has a film thickness of 20 nm, the Pt film 58 has a film thickness of 20 nm, the TiN film 59 has a film thickness of 50 nm. It is to be noted that the film thickness of the NiN film 56 is selected from a range of 50 nm-150 nm and the film thickness of the TiN film 59 is selected from a range of 20 nm-50 nm. In a case of using the TiN film 56 as a part of a lower electrode, the film thicknesses of the NiN film 56 and the TiN film 59 are to be suitably adjusted. It is to be noted that the film thickness of the NiO film 57 (to be used as a variable resistance film) is selected from a range of 10 nm-50 nm and the film thickness of the Pt film 58 is to be selected from a range of 10 nm-100 nm. In a case of using the TiN film 59 as a part of an upper electrode, the film thickness of the Pt film 58 may be, for example, 20 nm, and the film thickness of the TiN film 59 may be, for example, 50 nm.

The NiN film 56 (to be used as a lower electrode) is formed, for example, by sputtering where a NiN solid target is used. Alternatively, in a case where the variable resistance film (transition metal oxide film) 57 includes the same type of component (in this embodiment, nickel (Ni)) as the transition metal used for the lower electrode, a Ni transition metal target may be shared to form the variable resistance film 57. For example, the NiN film 56 may be formed by performing a sputtering process using a Ni target and introducing $N_2$ gas along with a slight amount of Ar gas to the Ni target. Then, after stopping the supply of the gases, the variable resistance film 57 is formed by performing a sputtering process using the Ni target and introducing $O_2$ gas to the Ni target. Thereby, the NiN film 56 and the NiO film (variable resistance film) 57 can be formed consecutively. Thus, the lower electrode film 56 and the variable resistance film 57 can be easily formed where the variable resistance film 57 includes the same type of component (in this embodiment, nickel (Ni)) as the transition metal used for the lower electrode.

Figure 6F:
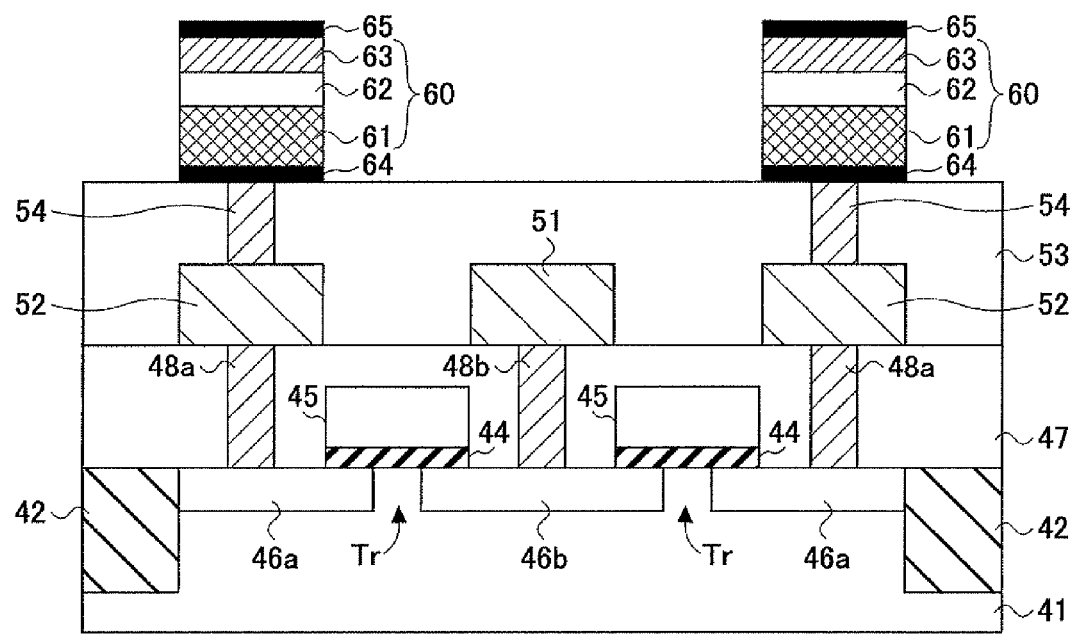

Then, as illustrated in FIG. 6F, the variable resistance device 60 is formed by performing photolithography or dry-etching on the TiN film 59, the Pt film 58, the NiO film 57, the NiN film 56, and the TiN film 55 in this order. In this example, the gas used for the dry-etching is a gas containing chlorine ($Cl_2$). The variable resistance device 60 includes a NiN lower electrode 61, a NiO variable resistance film 62, and a Pt upper electrode 63. The NiN lower electrode 61 is connected to the ground wiring (shared ground wiring) 51 via the transistors Tr. In this state, even though the side surfaces of the films 61, 62, 63 included in the variable resistance device 60 are exposed to the etching gas, the exposed side surfaces are protected from corrosion because the lower electrode 61 is formed of NiN which is anti-corrosive to chlorine. As a result, inconsistency of operation due to corrosion can be reduced. As described above, the TiN film 55 may be used as a part of the lower electrode, and the TiN (antireflection film) 59 may be used as a part of the upper electrode. After performing a patterning process on the variable resistance device 60, residual chloride remaining on the variable resistance device 60 is removed by cleansing with water.

Figure 6G:
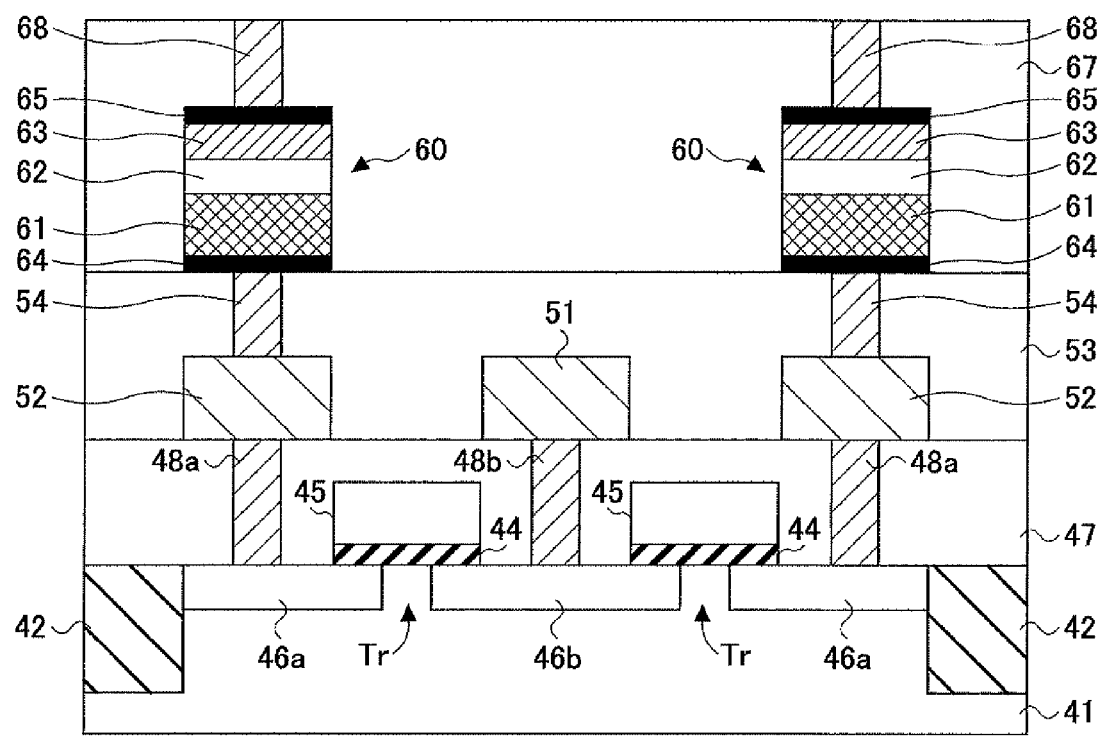

Then, as illustrated in FIG. 6G, a third interlayer insulation film 67 is deposited on the entire surface of the configuration illustrated in FIG. 6F by using a CVD method. Then, the third interlayer insulation film 67 is flattened. Then, contact holes (not illustrated) having a depth reaching the variable resistance device 60 are formed in the third interlayer insulation film 67. Then, the contact holes are filled with a TiN film (as metal barriers) and a tungsten (W) film by using a deposition method (e.g., sputtering method or a CVD method). Then, the deposited surface is flattened. As a result, contact plugs 68 that are electrically connected to the variable resistance device 60 are formed in the contact holes.

Figure 6H:
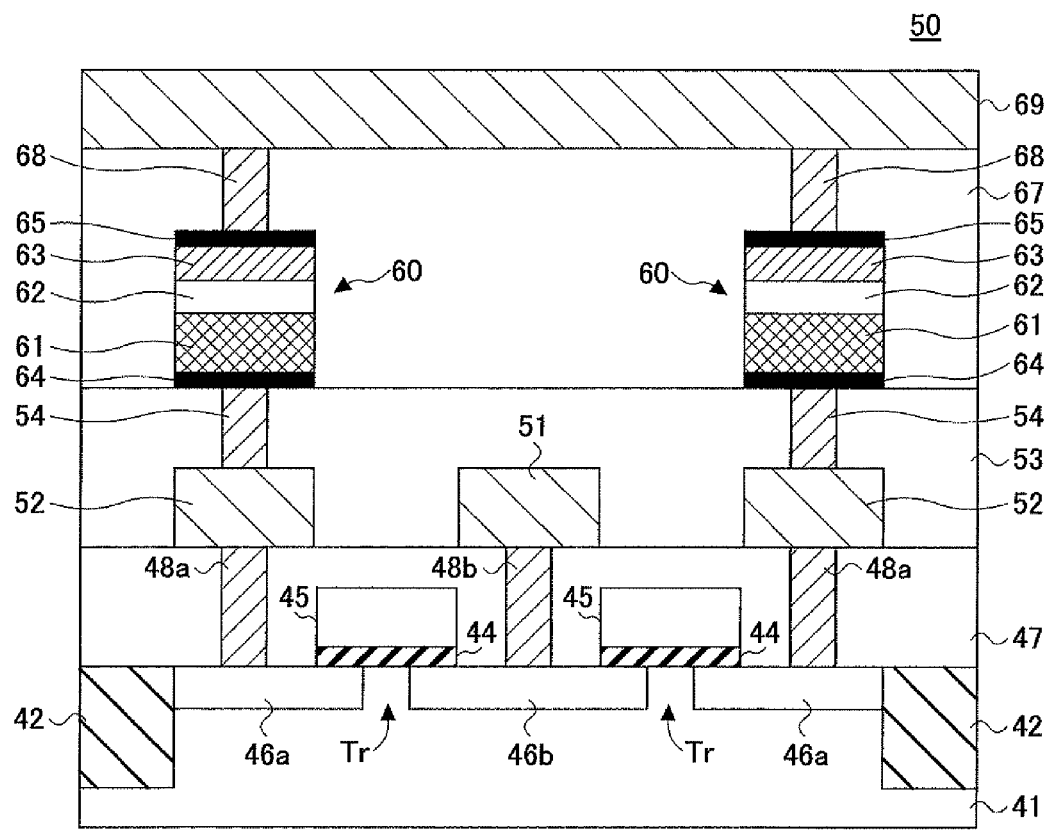

Then, as illustrated in FIG. 6H, a conductive film 69 (e.g., TiN/Al/TiN/Ti) is formed on the third interlayer insulation film 67 by using, for example, a sputtering method. Then, a bit line(s) is formed by processing the conductive film 69 into a desired shape. Multiple sets of the pair of selection transistors Tr and the pair of variable resistance devices 60 illustrated in FIG. 6H are arranged in a matrix to form a semiconductor storage device 50.

Next, an operation of manufacturing a ReRAM (semiconductor storage device) according to a second embodiment of the present invention is described with reference to FIGS. 7A through 7D. In the second embodiment, like components are denoted by like reference numerals as of the first embodiment and are not further explained. In the second embodiment, a ReRAM using the configuration of the variable resistance device 30 of FIG. 3B is fabricated. In the second embodiment, a lower electrode (ground side electrode) of a variable resistance device has a transition metal nitride film provided at an interface with a variable resistance film. The processes for fabricating selective transistors Tr and the first wiring layer (ground wiring 51 and relay wiring 52) and the processes for fabricating the contact plugs electrically connected to the selective transistors Tr and the first wiring layer are the same as those illustrated with FIGS. 6A through 6D. Therefore, detailed descriptions of the processes for fabricating selective transistors Tr and the first wiring layer and the processes for fabricating the contact plugs are omitted. Therefore, the operation of manufacturing a ReRAM (semiconductor storage device) according to the second embodiment of the present invention is described from the process of fabricating a variable resistance device.

Figure 7A:
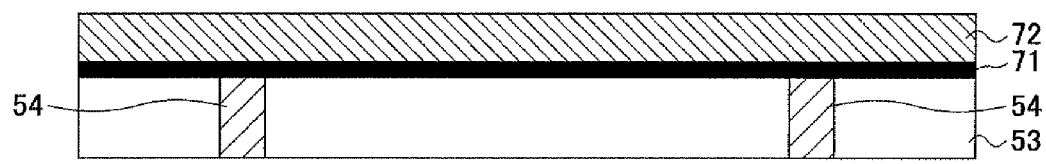
FIG. 7A-7D are schematic diagrams illustrating processes for manufacturing a semiconductor storage device including the variable resistance device of FIG. 3B.

First, in FIG. 7A, a TiN film 71 and an Ni film 72 are formed on the entire surface of the second interlayer insulation film 53 in a manner covering the second interlayer film 53 and the contact plugs 54. The TiN film 71 and the Ni film 72 are formed on the second interlayer insulation film 53 in this order by using, for example, a sputtering method. In this example, the TiN film 71 has a film thickness of 20 nm and the Ni film 72 has a film thickness of 100 nm.

Figure 7B:
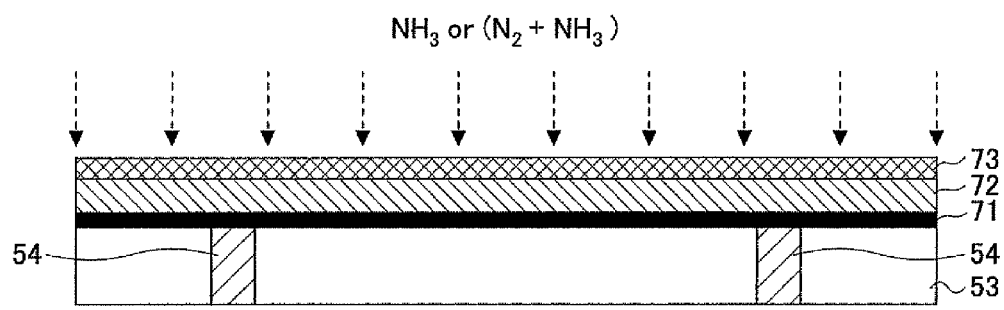

Then, as illustrated in FIG. 7B, a NiN film 73 is formed by nitriding the surface of the Ni film 72. The nitriding may be a plasma process using an ammonia ($NH_3$) gas or a mixture of $N_2$ gas and $NH_3$ gas. The plasma process is performed with RF (Radio Frequency) power of 400 W, a temperature of 350° C., a pressure of 5 Pa, and a time period of 1-3 minutes. In a case of nitriding by using $NH_3$ only, the amount of $NH_3$ gas is 100 cc. In a case of nitriding by a mixture of $N_2$ gas and $NH_3$ gas, the amount of the $N_2$ gas and the amount of $NH_3$ gas is 50 cc each. By performing the nitriding process, the NiN film 73 having a film thickness of 20-25 nm is formed on the Ni film 72 having a film thickness of 80 nm. Alternatively, the NiN film 73 may be formed by performing a $N_2$ annealing process instead of the plasma nitriding process.

Figure 7C:
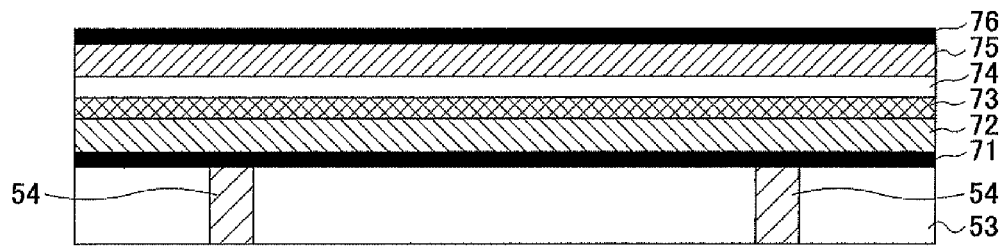
Figure 7D:
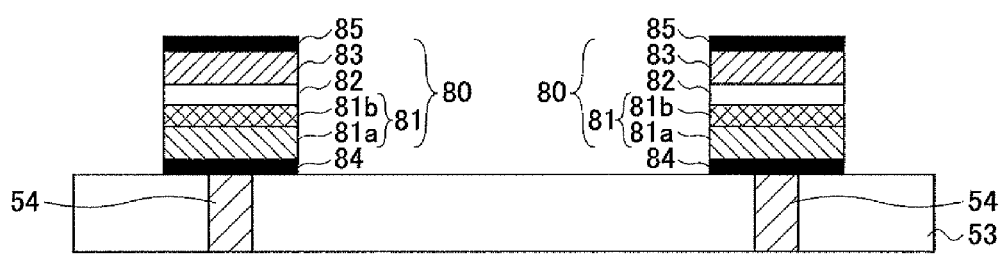

Then, as illustrated in FIG. 7C, a NiO film 74, a Pt film 75, and a TiN film 76 are deposited by a sputtering method in this order. In this example, the NiO film has a film thickness of 20 nm, the Pt film 74 has a film thickness of 20 nm, and the TiN film 76 has a film thickness of 50 nm. Then, as illustrated in FIG. 7D, a variable resistance device 80 is formed by performing photolithography or dry-etching on the TiN film 76, the Pt film 75, the NiO film 74, the NiN film 73, the Ni film 72 and the TiN film 71 in this order. The processes following the process illustrated in FIG. 7D are the same as those illustrated in FIGS. 6G and 6H.

Accordingly, the variable resistance device 80 includes a ground side electrode (lower electrode) 81, a NiO film 82 serving as the variable resistance film, and a positive side electrode (upper electrode) 83. The lower electrode 81 includes a NiN film 81b located at the interface with the NiO film (variable resistance film) 82 and a Ni film 81 positioned toward the ground side. With this configuration of the variable resistance device 80, the NiN film 81b located at the interface with respect to the NiO film prevents corrosion from chloride gas used in the dry-etching process. Accordingly, inconsistency of the reset current can be prevented. This is because the increase/decrease of the filament (conduction path) for changing the resistance value has a significant influence on the state of the interface between the electrodes and the variable resistance film.

FIGS. 8 and 9 illustrate tables for describing a method of fabricating a variable resistance device according to a third embodiment of the present invention. In the third embodiment, like components are denoted by like reference numerals as of the first and second embodiments and are not further explained. Similar to the variable resistance device 30 illustrated in FIG. 3B, the variable resistance device of the third embodiment includes the lower electrode 31 having a two layer structure of an NiN film 31b located at the interface with the variable resistance film 32 and a NiN film 31a located toward the ground side.

In the above-described second embodiment, the two layer structure of the Ni film 31a and the NiN film 31b is fabricated by performing a plasma nitriding process or a nitrogen annealing process on the surface of a Ni film deposited beforehand. In the third embodiment, the two layer structure of the Ni film 31a and the NiN film 31b is fabricated by consecutively depositing a Ni film and a NiN film.

With a recipe described with the table of FIG. 8, Ar gas is introduced into a chamber containing a Ni target for 20 seconds (Step 1). Then, the Ni film 31a is formed by turning on the power of the plasma performing sputtering for 30 seconds (Step 2). Then, the NiN film 31b is consecutively formed by changing the supplied gas from Ar gas to a mixed gas of Ar gas and N2 gas having a ratio of 1:9 without turning off the power of the plasma (Step 3). Then, after the forming of the NiN film 31b is completed, the plasma is turned off and the gas supply is stopped (Step 4).

With the method described with FIG. 8, the time for forming the Ni film 31a and the NiN film 31b is short. However, with the method described with FIG. 8, the boundary between the Ni film 31a and the NiN film 31b is vague because the Ni film 31a gradually turns into the NiN film 31b. Nevertheless, the state of the boundary between the Ni film 31a and the NiN film 31b does not affect the switching characteristic of the resistances because the switching characteristic of the resistances is defined by the interface area with respect to the variable resistance film 32. That is, as long as the NiN film 31b is formed toward the interface with respect to the variable resistance film 32, the state of the boundary between the Ni film 31a and the NiN film 31b does not affect the switching characteristic of the resistances.

With a recipe described with the table of FIG. 9, the boundary between the Ni film 31a and the NiN film 31b is clear. After the Ni film 31a is formed by performing the Steps 1 and 2 of FIG. 9, the power of the plasma is turn off and the gas supply is stopped for 30 seconds (Step 3). Then, a mixed gas of Ar gas and N2 gas having a ratio of 1:9 is supplied (Step 4). Then, the NiN film 41b is formed by turning on the power of the plasma (Step 5). Then, after the forming of the NiN film 31b is completed, the plasma is turned off and the gas supply is stopped (Step 6).

The NiN (transition metal nitride film) 31b can be formed toward the interface with the variable resistance film 32 whether the recipe of FIG. 8 or the recipe of FIG. 9 is used.

Figure 10A:
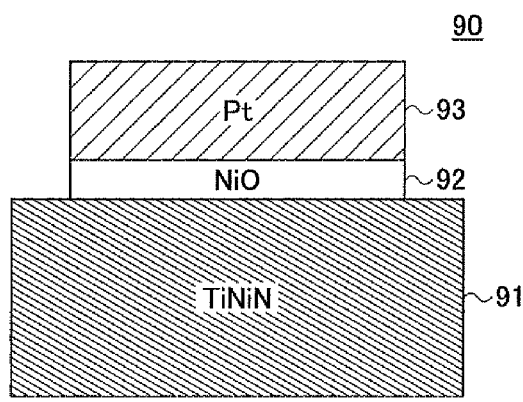
FIG. 10A is a cross-sectional view illustrating a configuration of a variable resistance device according to another embodiment of the present invention.

FIG. 10A is a cross-sectional view illustrating a configuration of a variable resistance device 90 according to a fourth embodiment of the present invention. In the fourth embodiment, a titanium nickel nitride $(Ti_{1-x}Ni_x)N$ is used as a lower electrode 91. As described above, although the use of nickel nitride (NiN) as a lower electrode reduces the amount of current required for operation (operation current), the use of nickel nitride (NiN) as the lower electrode makes fabrication slightly difficult. On the other hand, although the use of titanium nitride (TiN) increases the amount of current required for operation, the difficulty of fabrication can be resolved. Accordingly, by using the lower electrode 91 containing a combination of TiNiN, both the advantages of facilitating fabrication and reducing the amount of current required for operation can be attained. In the fourth embodiment, the variable resistance device 90 includes an upper electrode 93 formed of Pt, a variable resistance film 92 formed of NiO, and the lower electrode 91 formed of TiNiN.

The processes for fabricating a ReRAM including the variable resistance device 90 are basically the same as those illustrated in FIGS. 6A through 6H. However, in the process of FIG. 6E, a TiNiN film is formed on the TiN barrier film 55 instead of The NiN film 56. In forming the TiNiN film, a sputtering process is performed on a TiNiN target containing TiNiN of a suitable ratio. By forming the TiNiN film, the fabrication of the lower electrode 91 is facilitated. In a case of expressing the composition of the TiNiN film as $(Ti_{1-x}Ni_x)N$, the composition of Ni is preferably $0<x\leq0.2$. That is, the ratio of Ni with the whole TiNi is preferably equal to or less than 20%.

Figure 10B:
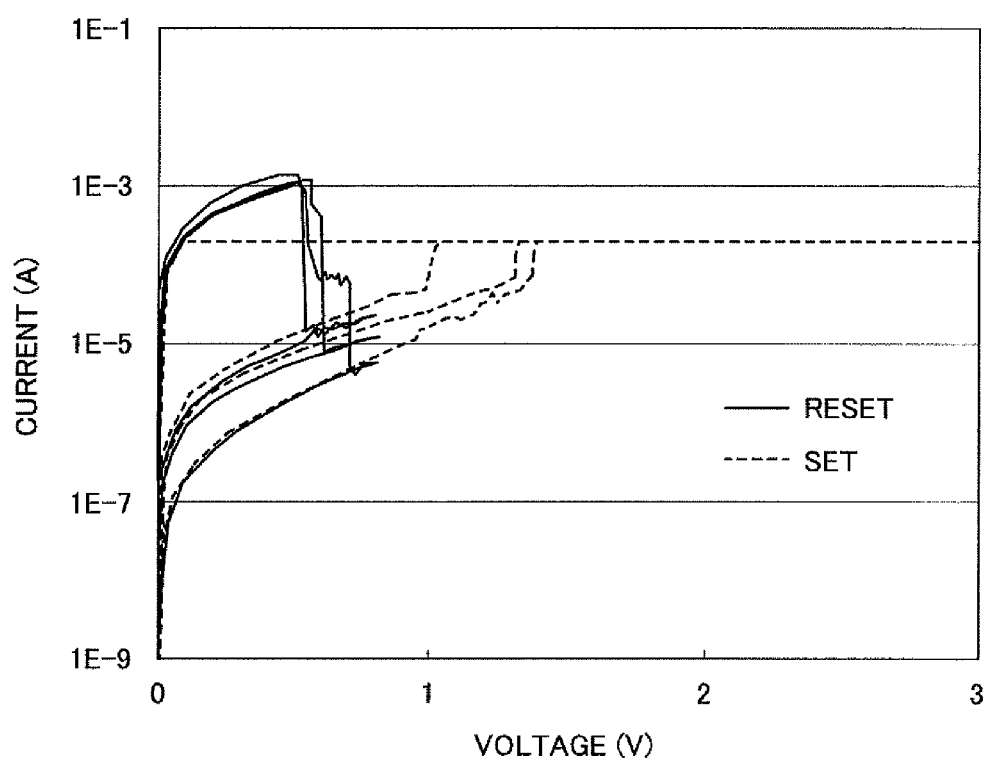
FIG. 10B is a graph illustrating an electric characteristic of the variable resistance device of FIG. 10A in a case where the Ni content is 8%.

FIG. 10B is a graph illustrating an electric characteristic of the variable resistance device 90 where the Ni composition x is 0.08 (Ni content of 8%). In the graph of FIG. 10B, the solid line indicates a reset current for switching from low resistance to high resistance and the dotted line indicates a set current for switching from high resistance to low resistance. As illustrated with the solid line, a low operation current of 1 mA or less and little scattering in a loop of 3 times are exhibited during a reset operation. This indicates that improvement of fabrication precision and resolving of corrosion problems are achieved by forming the lower electrode 91 with TiNiN. As a result, a stable electric characteristic is attained.

FIG. 11 is a table illustrating a relationship between the Ti:Ni ratio of a TiNi target and yield of a variable resistance device. In a case where the content of Ti and Ni is 100, the yield of the variable resistance device becomes equal to or less than 60% when the Ni ratio is greater than 20%. In a case where the content of Ti and Ni is 100, the yield of the variable resistance device becomes 70%-90% when the Ni ratio is equal to or less than 20%. Accordingly, the variable resistance device 90 according to the fourth embodiment can attain a satisfactory electric characteristic along with attaining a high yield.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the NiO film used as the variable resistance film may be formed by methods other than sputtering. The NiO film may be formed by other methods conceivable for one skilled in the art such as by performing a heating process in an oxygen-containing atmosphere after forming the Ni film.

What is claimed is:
1. A variable resistance device comprising:
   a first electrode including a transition metal nitride film;
   a second electrode including a precious metal or a precious metal oxide; and
   a transition metal oxide film interposed between the first and second electrodes;
   wherein the first electrode includes a ground side film located toward a ground side of the variable resistance device and an interface side film provided at an interface with respect to the transition metal oxide film,
   wherein the ground side film includes a transition metal film, and wherein the interface side film includes the transition metal nitride film.

2. The variable resistance device as claimed in claim 1, wherein the transition metal oxide film and the transition metal nitride film of the first electrode contain the same type of transition metal.

3. The variable resistance device as claimed in claim 1, wherein the transition metal nitride film includes a nitride of at least a metal selected from a group consisting of nickel, titanium, vanadium, manganese, iron, cobalt, zinc, yttrium, zirconium, niobium, molybdenum, hafnium, tantalum, and tungsten.

4. The variable resistance device as claimed in claim 1, wherein the transition metal oxide film includes an oxide of a metal selected from a group consisting of nickel, titanium, vanadium, manganese, iron, cobalt, zinc, yttrium, zirconium, niobium, molybdenum, hafnium, tantalum, and tungsten.

5. A method for manufacturing a variable resistance device comprising:
    forming a first electrode including a transition metal nitride film above a semiconductor substrate;
    forming a transition metal oxide film on the transition metal nitride film; and
    forming a second electrode including a precious metal or a precious metal oxide on the transition metal oxide film;
    wherein the first electrode includes a ground side film located toward a ground side of the variable resistance device and an interface side film provided at an interface with respect to the transition metal oxide film,
    wherein the ground side film includes a transition metal film, and
    wherein the interface side film includes the transition metal nitride film.

6. The method for manufacturing a variable resistance device as claimed in claim 5, wherein the forming of the transition metal nitride film includes performing a sputtering process on a target containing a transition metal.

7. The method for manufacturing a variable resistance device as claimed in claim 5, wherein the forming of the transition metal nitride film includes
    forming a first transition metal film above the semiconductor substrate, and
    nitriding the first transition metal film.

8. The method for manufacturing a variable resistance device as claimed in claim 7, wherein the nitriding of the first transition metal film includes
    heating the first transition metal film inside a nitride containing ambient.

9. The method for manufacturing a variable resistance device as claimed in claim 7, wherein the nitriding of the first transition metal film includes
    performing a plasma process on the first transition metal film in an ammonia-containing atmosphere.

10. The method for manufacturing a variable resistance device as claimed in claim 5, wherein the nitriding of the first transition metal film includes
    forming the transition metal oxide film by performing a sputtering process on a target containing a transition metal.

11. The method for manufacturing a variable resistance device as claimed in claim 5, wherein the forming of the transition metal oxide film includes
    forming a second transition metal film, and
    heating the second transition metal film in a oxygen-containing atmosphere.

12. The method for manufacturing a variable resistance device as claimed in claim 5, further comprising
    etching the transition metal nitride film, the transition metal oxide film, and the precious metal film by using a gas including chlorine.

13. The method for manufacturing a variable resistance device as claimed in claim 12, further comprising
    cleansing the transition metal nitride film, the transition metal oxide film, and the precious metal film after the etching of the transition metal nitride film, the transition metal oxide film, and the precious metal film.

14. The method for manufacturing a variable resistance device as claimed in claim 5, further comprising
    using the same type of transition metal for forming the transition metal oxide film and the transition metal nitride film.

15. The method for manufacturing a variable resistance device as claimed in claim 5,
    wherein the forming of the transition metal nitride film includes performing a sputtering process on a target containing a transition metal in a nitride-containing atmosphere,
    wherein the forming of the transition metal oxide film includes performing another sputtering process on the target in an oxygen-containing atmosphere,
    wherein the forming of the transition metal nitride film and the forming of the transition metal oxide film are performed consecutively.

16. A semiconductor storage device comprising:
    a plurality of selection transistors;
    a plurality of variable resistance devices connected to corresponding plural selection transistors;
    wherein each of the plural variable resistance devices includes
    a first electrode including a transition metal nitride film;
    a second electrode including a precious metal or a precious metal oxide; and
    a transition metal oxide film interposed between the first and second electrodes,
    wherein the first electrode includes a ground side film located toward a ground side of the variable resistance device and an interface side film provided at an interface with respect to the transition metal oxide film,
    wherein the ground side film includes a transition metal film, and
    wherein the interface side film includes the transition metal nitride film.

17. The semiconductor storage device as claimed in claim 16, wherein the corresponding pairs of the plural selection transistors and the plural variable resistance devices are formed in a matrix-like arrangement.

18. The semiconductor storage device as claimed in claim 16, further comprising
    a bit wiring connected to the second electrode; and
    a ground wiring connected to the first electrode via plural of the selection transistors.

19. The semiconductor storage device as claimed in claim 16, wherein the transition metal oxide film and the transition metal nitride film of the first electrode contain the same type of transition metal.

20. The semiconductor storage device as claimed in claim 16, wherein the transition metal nitride film contains $Ni_xN_y$ ($0<x\leq3$, $0<y\leq2$), wherein the transition metal oxide film contains $NiO_z$ ($0<z\leq-2$).

* * * * *